(12) United States Patent
Klein et al.

(10) Patent No.: US 8,391,056 B2
(45) Date of Patent: Mar. 5, 2013

(54) MAGNETIC VORTEX STORAGE DEVICE

(75) Inventors: Olivier Klein, Montrouge (FR);
Grégoire De Loubens, Paris (FR);
Benjamin Pigeau, Montesson (FR)

(73) Assignee: Commissariat à l'énergie atomique et aux energies alternatives, Paris (FR)

( * ) Notice: Subject to any disclaimer, the term of this patent is extended or adjusted under 35 U.S.C. 154(b) by 0 days.

(21) Appl. No.: 13/265,501

(22) PCT Filed: Apr. 22, 2010

(86) PCT No.: PCT/EP2010/055394
§ 371 (c)(1),
(2), (4) Date: Nov. 30, 2011

(87) PCT Pub. No.: WO2010/122126
PCT Pub. Date: Oct. 28, 2010

(65) Prior Publication Data
US 2012/0063219 A1    Mar. 15, 2012

(30) Foreign Application Priority Data
Apr. 23, 2009  (FR) .................................... 09 52656

(51) Int. Cl.
*G11C 11/00*    (2006.01)
(52) U.S. Cl. ......................................... 365/158; 365/67
(58) Field of Classification Search .................. 365/158, 365/171, 173, 66, 67, 130
See application file for complete search history.

(56) References Cited

U.S. PATENT DOCUMENTS

| 7,072,208 | B2 |   | 7/2006  | Min et al.     |         |
|-----------|----|---|---------|----------------|---------|
| 8,085,582 | B2 | * | 12/2011 | Nakamura et al.| 365/158 |
| 8,094,487 | B2 | * | 1/2012  | Kim et al.     | 365/158 |
| 8,199,553 | B2 | * | 6/2012  | Chen et al.    | 365/130 |

FOREIGN PATENT DOCUMENTS

| EP | 1 262 992 B1    | 7/2006  |
| EP | 1 622 161 B1    | 10/2008 |
| WO | WO 2009/051442  | 4/2009  |

OTHER PUBLICATIONS

International Search Report as issued for PCT/EP2010/055394.

* cited by examiner

*Primary Examiner* — Tuan T Nguyen
*Assistant Examiner* — Lance Reidlinger
(74) *Attorney, Agent, or Firm* — Pillsbury Winthrop Shaw Pittman, LLP

(57) ABSTRACT

A magnetic storage device includes a network of planar magnetic cells in a vortex state, each cell's vortex core having a magnetization with either a first and second equilibrium position in opposite direction and perpendicular to the cellular plane, each of the two positions representing binary information. The device includes conductive lines for writing binary information stored in the cells, including conductive lines for selectively applying, in the vicinity of each cell, a first bias static magnetic field roughly perpendicular to the cellular plane and a linearly polarized radio frequency magnetic field roughly parallel to the device. The described device also includes conductive lines for reading preferably resonantly the polarity using a selective transport measurement between two intersecting electrodes by guiding the current lines through the region around the vortex core by means of a point contact.

22 Claims, 3 Drawing Sheets

MAGNETIC VORTEX STORAGE DEVICE

CROSS REFERENCE TO RELATED APPLICATIONS

This application is the U.S. National Stage of PCT/EP2010/055394, filed Apr. 22, 2010, which in turn claims priority to French Patent Application No. 09/52656, filed Apr. 23, 2009, the entire contents of all applications are incorporated herein by reference in their entireties.

This invention relates to a magnetic vortex storage device. It has an application in information technology, particularly in the production of memory cells and non-volatile MRAM ("Magnetic Random Access Memory") to replace volatile random access memory in semiconductor devices.

In a known manner, the vortex state is the lowest energy magnetic configuration at remanence of a nanostructure (typically a nanodisk). Throughout the description, we will use the term platelet to describe the form of the memory cell that corresponds to all basic magnetic nano-objects in a vortex state.

The conditions having to do with the presence of a vortex state of a cell have already been described, particularly in "Single Domain Circular Nanomagnets" (Coburn et al.—Physical Review Letters—Volume 83, Number 5, Aug. 2, 1999). A cell in a vortex state has a spatially inhomogeneous magnetic configuration (i.e. the magnetization that points to different direction, depending on the point of location inside of the cell). FIG. 1 shows the orientation of the magnetization on a cell C in a vortex state, the cell having, for example, the shape of a nanodisk. The magnetization (the magnetization vectors are represented by arrows) is located in the cellular plane and turns clockwise or counterclockwise (clockwise is shown here). The magnetization of the cell appears spontaneously (i.e. without an external field), the circular configuration of the magnetization being explained by the spontaneous minimization of the dipolar stray field. There is therefore a first degeneracy of the magnetic configuration of a cell in a vortex state, called chirality, whose sign c=⊕1 depends on the direction in which the magnetization is rotating in the plane. There is also a singularity at the center of the cell (in an area V, called the "vortex core") in which the magnetization can no longer turn. This central area V (with a diameter of a few nanometers) has dimensions that are roughly equal to the characteristic length of exchange $L_{ex}$ (i.e. about 5 nm), which defines the minimum length below which the magnetization can no longer vary. Because the magnetization cannot vary within the vortex core V, it will tend to leave the cellular plane perpendicularly upward (the magnetization or polarity of the core p is +1) or downward (the magnetization or polarity of the core p is −1). There is therefore a second degeneracy of the magnetic configuration of the cell in a vortex state based on the vortex core polarity having a magnetization that is perpendicular to the cellular plane pointing upward (p=+1) or downward (p=−1).

There are MRAM magnetic storage devices that use a set of memory cells in the vortex state. The document U.S. Pat. No. 7,072,208 describes such an MRAM device comprising a magnetic tunnel junction with a free layer and a reference layer separated by a tunnel barrier, with each of the two layers being in a vortex state. According to this device, we use the chirality c of the rotating magnetization (fixed for the reference layer and variable between clockwise and counterclockwise in the free layer) to measure the variation of resistance and to determine the binary information ("0" or "1"). The orientation of the magnetization (clockwise versus counterclockwise) is changed by applying a large static magnetic field. However, obtaining such a device is rather complex and requires the presence of a reference layer for measuring the resistance of the magnetic tunnel junction. Also, a lot of energy is required for the writing phase and for reversing the chirality of the magnetization.

"Polarization Selective Magnetic Vortex Dynamics and Core Reversal in Rotating Magnetic Fields" (Curcic et al.—Physical Review Letters, 2008, 101, 197204) describes a method for selectively reversing the magnetization of the vortex core at zero magnetic field (or remanence) using an oscillating magnetic field at the resonant frequency with a controlled right or left circular polarization, this field being oriented parallel to the cellular plane. The vortex core's response to this periodic excitation corresponds to a circular movement (gyrotropic movement) of the vortex core around its equilibrium position, the vortex core (similar to a spring) having a relatively low spring constant. Each of the two possible core polarity have their own sense of gyration so that to excite the gyrotropic movement it is required to apply the proper circularly polarized magnetic field with left or right polarization depending if the vortex core polarity is oriented upward or downward. The direction of rotation is independent of the chirality of the vortex and depends only on the polarity of the vortex core. When the radius of gyration increases, the speed of displacement of the core also increases until it reaches a critical speed causing a reversal of the vortex core. Once the core's polarity is reversed, it returns to its central equilibrium position. However, this method poses some technical challenges because it requires the generation of a controlled circular polarization, which is extremely difficult to do technically.

In this context, the purpose of this invention is to provide a magnetic device comprising a network of cells in a vortex state that do not require the generation of circularly polarized oscillating magnetic field and that significantly reduce energy consumption in the writing phase when it is necessary to use an excitation to change the state of the cell.

For this purpose, the invention proposes a magnetic storage device comprising a network of flat magnetic cells on a substrate, the dimensions of each magnetic cell being chosen such that the cell is in a vortex state, the vortex core of each cell having a magnetization with a first and second equilibrium position in the opposite direction and roughly perpendicular to said cellular plane, each of said two positions representing a piece of binary information, said device being characterized in that it comprises means for writing binary information stored in the cells, said means of writing including means for selectively and simultaneously applying the following in the vicinity of each cell:
  a first static magnetic field $H_E$ with roughly perpendicular bias to said cellular plane;
  a radio frequency magnetic field with linear polarization, including two right and left circularly polarization roughly parallel to said cellular plane,
such that:
  the simultaneous application of said first static magnetic field $H_E$ and said radio frequency magnetic field at a first frequency on the selected cell causes:
    a switch in the magnetization direction of said vortex core located in the first equilibrium position toward the second equilibrium position under the effect of a circular movement of the core around said first equilibrium position, causing the reversal in the magnetization, said vortex core rotating by being coupled to one of the two circular polarization;

the maintenance of the magnetization direction of said vortex core located in the second equilibrium position;

the simultaneous application of said first static magnetic field $H_E$ and said radio frequency magnetic field at a second frequency that is different than said first frequency on the selected cell causes:

a switch in the magnetization direction of said vortex core located in the second equilibrium position toward the first equilibrium position under the effect of a circular movement of said core around said second equilibrium position, causing the reversal in the magnetization, said vortex core rotating by being coupled to one of the two circular polarization;

the maintenance of the magnetization direction of said vortex core located in the first equilibrium position.

Thanks to the invention, there is a lift of degeneracy due to the polarity of the vortex core, voluntarily created and controlled both by a static bias magnetic field and by the geometric shape of the cell, resulting in the vortex state.

A planar radio frequency magnetic field with linear polarization is therefore used, which includes both a right circularly polarized field and a left circularly polarized field, and the radio frequency (parallel to the cellular plane) and a static perpendicular magnetic field are added. The presence of this static field makes it possible to get two different resonant frequencies, depending on whether we are trying to reverse the polarity of the vortex core from downward to upward or from upward to downward. By using the resonance phenomenon to amplify the response to the excitation, the frequency required to reach the threshold speed for the reversal of the vortex core, beyond which its polarity is reversed, differs according to whether the polarity is initially upward or downward. In the specific case of remanence (where the static field is zero), the use of only a linearly polarized microwave field (i.e. containing the two circularly polarized components) would not solve the problem because, although there would be multiple reversals in polarity, it would requires highly precise timing in the microwave pulse writing. In a zero static field, the magnetization at the vortex core would turn, by coupling with one of the two circular polarization contained in the linearly polarized radio frequency field at approximately the same frequency (ex. clockwise for upward magnetization and counterclockwise for downward magnetization) until it reverses. Once reversed, it could return again to the other polarity, which would be coupled with the other circular polarization, also included in the linear polarization of the radio frequency field. We would therefore have a random state without control over the magnetization state of the vortex core, being unable to very precisely control the amplitude, duration, and shape of the radiofrequency pulse based on the exact geometry of each cell. By adding the field's static component, we introduce a frequency discrimination such that the first polarity (ex. p=+1) turns more quickly than the second polarity (ex. p=−1), so the resonance frequency of the radio frequency magnetic field needed to reverse the core's magnetization from downward to upward is different than the radio frequency magnetic field needed to reverse the core's magnetization from upward to downward. The advantage of such a device is that it makes it possible to selectively control the frequency for writing information to a cell (typically a first polarity p=+1 representing a binary "1" and a second polarity p=−1 representing a binary "0"). Because the magnetization reversal is based on a resonant phenomenon, it is not necessary to apply a high intensity radio frequency magnetic field in order to reach the critical speed to allow a reversal of the vortex core. The resonant phenomenon's leveraging effect make it even more important for the resonance line to be narrow, which can be achieved by using materials with very low magnetic damping. In addition, the line's narrow width increases selectivity, as we will see below. With regard to the power required to reverse p, nonlinear processes dominate. They involve a shift (of about the width of the line) in the optimal writing frequency toward lower frequencies relative to the nominal resonance frequency. Using a linearly polarized radio frequency field makes it possible to include two circular polarizations without having to generate a right and left circular field, which are difficult to obtain. It has been established that overlapping two right and left circular polarization fields rotating in opposite directions forms a linearly polarized field. Conversely, a circular polarization is itself implicitly the combination of two linear polarization, which are then separated by ¼ turn. According to prior art as described above (see specifically "Polarization Selective Magnetic Vortex Dynamics and Core Reversal in Rotating Magnetic Fields" (Curcic et al.—Physical Review Letters, 2008, 101, 197201), the deterministic reversal of a vortex core requires control over the direction of circular polarization. At the microwave frequencies used, such control is very difficult to achieve. One way consists of crossing two antennas, each generating a linear field out-of-phase by 90°. Therefore, depending upon whether the phase shift is before or after a quadrature, we will then locally have a right or left circular polarization. Conversely, the device according to the invention does not need to control the direction of the right or left circular polarization. The implementation of the device according to the invention achieves a deterministic reversal with a linearly polarized field (i.e. obtains with a single antenna), advantageously using the fact that the linearly polarized field is the overlap of two right and left circularly polarized field and therefore without controlling the circular polarization.

Once the magnetization of the core is reversed due to one of the two circular components of the linear field with the right resonant frequency, the other circular component of the linear magnetic field will be very weakly coupled to the vortex because, since the frequency is not equal to the resonant frequency needed to rotate the vortex, the vortex core will remain virtually immobile. Therefore, to change the core's polarity again, we would have to change the frequency of the radio frequency field to be the right resonant frequency to lead to gyration:

The device according to the invention may also have one or more of the characteristics below, considered individually or according to all of the technically possible combination:

the device according to the invention comprises a means for reading binary information stored in the cells, said means for reading including:

a means for simultaneously applying the following in the vicinity of the cell to be read:

a second static bias magnetic field (denoted hereafter as $H_L$) roughly perpendicular to said cellular plane;

a radio frequency magnetic field with linear polarization roughly parallel to said cellular plane;

such that when the frequency of said radio frequency magnetic field is equal to a third frequency, the simultaneous application of said second static magnetic field and said radio frequency magnetic field on the selected cell results in:

an absorption of the radio frequency power by the cell corresponding to the excitation of a circular movement of said vortex core located in the first equilibrium position around said first equilibrium position, this rf absorption resulting in a local heating without resulting in the magnetization reversal;

the maintenance of the magnetization direction of said vortex core located in the second equilibrium position;

means for selectively injecting in the cell a reading probe current;

to be selective in frequency, the amplitude (the absolute value is implied) of the roughly perpendicular static bias magnetic field H to said first ($H_E$ writing phase) and said second ($H_L$ reading phase) static magnetic field is such that: Hmin<H<Hmax where Hmin=αHs means the width of the resonance frequency line expressed in terms of Hs, Hs meaning the cell's saturation magnetic field, and α meaning the Gilbert magnetic damping coefficient. Hmax means the amplitude of the static field that would result in the reversal of the magnetization direction of the vortex core;

preferably, the amplitude of said first static field is greater than the amplitude of said second static field said means for selectively injecting in the cell a probe reading current include a point contact for circulating the current roughly through the region around the vortex core of said cell to be read;

said means of writing comprise a plurality of parallel first conductive lines arranged in the vicinity of said cells, each of said lines being able to receive a current of equal frequency at said first frequency or at said second frequency for the application of a linearly polarized field radio frequency magnetic field at said first frequency or at said second frequency roughly parallel to the cellular plane located below said line;

each of said lines of said plurality of first lines is able to receive a current of equal frequency to said third frequency for the application of a linearly polarized radio frequency magnetic field to said third frequency roughly parallel to the cellular plane located below said line;

said means for writing comprise a plurality of pairs of conductive lines arranged in a single plane in the vicinity of said cells, the lines of a single pair being arranged on both sides of a row of cells, each of said lines being able to receive a continuous current such that two successive lines from a single pair receive a current in the opposite direction for the application of a component of said first bias static magnetic field roughly perpendicular to the cellular planes in the vicinity of the cells located between the two successive lines;

two lines from a single pair are rippled such that they surround the cells located between the two lines;

said means of writing comprise a permanent magnet parallel to the substrate for the application of a component of said first static bias magnetic field roughly perpendicular to the cellular plane;

said permanent magnet is arranged under said substrate and is made of a material such as BiMn, AlNiCo, or RCo, where R=Y, La, Pr, Nd, or Sm;

said permanent magnet is made in the form of a magnetic layer having perpendicular anisotropy;

said means for applying said second static magnetic fields are formed by said permanent magnet parallel to the substrate;

said cells are made of a ferromagnetic material having a Gilbert magnetic damping coefficient that is less than or equal to 0.03;

said cells are made of a ferromagnetic material having a Gilbert magnetic damping coefficient that is greater than or equal to 0.0001;

said cells are made of a ferromagnetic material selected from among the following materials:

a metal alloy like an NiFe alloy;

a metallic monocrystal, such as a Heusler alloy like NiMnSb, $CO_2MnSi$, or $CO_2MnAl$ or such as a pure metal like Fe;

a magnetic semiconductor such as GaMnAs;

an insulating monocrystal, such as $Y_3Fe_5O_{12}$ or $Fe_3O_4$, covered by a conductive layer serving as a bolometric detector;

each of said cells has a circular, elliptical, or plane-parallel shape;

the width or the smallest dimension (i.e. the diameter in the case of a circular cell and the smaller of the two diameters in the case of an elliptical cell) of each of the said cells is between 10 nm and 1.0 μm;

each of said cells has a thickness between 3 nm and 100 nm;

each of said cells has an aspect ratio (=thickness/width) β that is less than or equal to 2;

said first frequency is roughly equal to the resonant frequency of gyration at the vortex core in its first equilibrium position and said second frequency is roughly equal to the resonant frequency of gyration of the vortex core in its second equilibrium position;

in the strategy where the amplitude (i.e. the absolute value) of the first static field (static writing field $H_E$) is greater than the amplitude of the second static field (static reading field $H_L$), said first frequency may also be greater than or equal to the resonant frequency of gyration of the vortex core in its first equilibrium position and less than or equal to the sum of said resonant frequency of gyration of the vortex core in its first equilibrium position and half the line width of said resonant frequency of gyration of the vortex core in its first equilibrium position and;

said second frequency may also be less than or equal to the resonant frequency of gyration of the vortex core in its second equilibrium position and greater than or equal to the difference between said resonant frequency of gyration of the vortex core in its second equilibrium position and half the line width of said resonant frequency of gyration of the vortex core in its second equilibrium position.

Other characteristics and advantages of the invention will be clear from the description given in the non-exhaustive list of examples below, with reference to the attached figures, among which:

FIG. 1 shows the direction of the magnetization on a cell in a vortex state;

FIG. 2 schematically shows a first embodiment of a magnetic device according to the invention;

Figure 2:
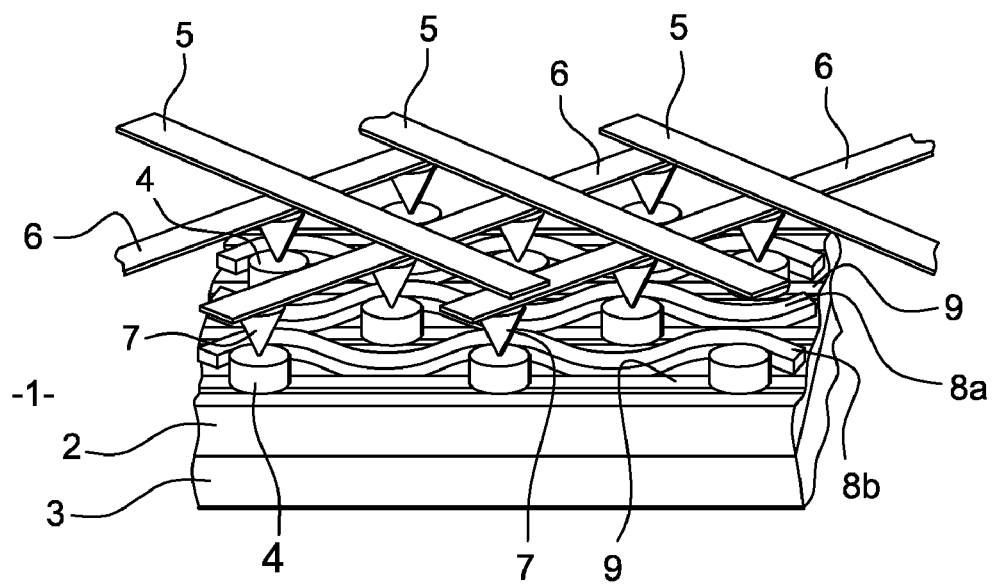

FIG. 2 schematically shows a first embodiment of a magnetic device 1 according to the invention.

The device 1 comprises:

a substrate 2;

a permanent magnet 3;

a network of flat magnetic cells 4 shaped as nanodisks.

a plurality of first conductive lines 5 arranged parallel to each other as a first level of metallization;

a plurality of second conductive lines 6 arranged parallel to each other as a second level of metallization;

a plurality of cones 7 ensuring electrical contact between the second lines 6 and the cells 4 located below the second lines 6;

a plurality of ripples conductive line pairs 8a and 8b, arranged on the substrate 2 as a third level of metallization;

a plurality of third conductive lines 9 arranged parallel to each other as a fourth level of metallization.

Figure 3:
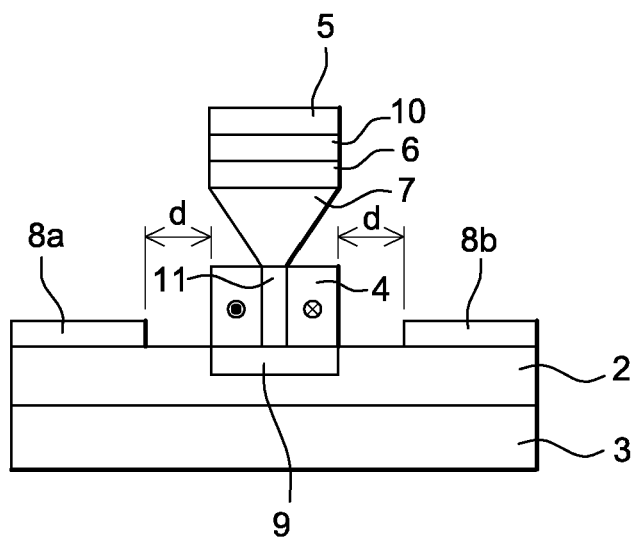
FIG. 3 is a cross-sectional view of a single cell of the device in FIG. 2, along a plane perpendicular to the substrate plane.

FIG. 3 is a cross-sectional view of a single cell 4 along a plane perpendicular to the substrate plane 2 and intersecting said first 5 and second 6 lines located above the cell 4, the third line 9 located below the cell 4, and the pair of lines 8a and 8b located on either side of the cell 4.

Similarly to semiconductor integrated circuits, the device according to the invention is made by a plurality of layers, with alternating conductive layers, also called "levels of metallization", that have metalized conductive lines extending parallel to said layer and the insulating layers. The levels of metallization are ordered from highest to lowest (i.e. the first level of metallization is the highest).

Generally, each conductive line is shown here as a conductive strip.

Figure 1:
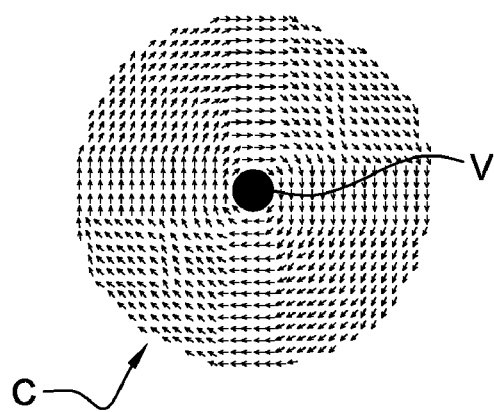

Each cell 4 is a nanodisk, or platelet, in the vortex state. The cell 4 here is shaped like a disk, but it is also possible to have a cell with another shape (ex. elliptical or plane-parallel) because the vortex state is present. As we already mentioned in the introduction, the vortex state is the lowest energy magnetic configuration for the magnetization of a remanent nanostructure. A cell in a vortex state has a spatially inhomogeneous magnetic configuration (i.e. the magnetization has a different orientation, depending on the point where the inside of the cell is located). As shown in FIG. 1, the direction of the magnetization on a cell C in a vortex state is located in the cellular plane and turns clockwise or counterclockwise (clockwise is shown here). The magnetization of the cell appears spontaneously (i.e. without an external field), the circular behavior of the magnetization being explained by the spontaneous minimization of the leakage field. There is therefore a first degeneration of the magnetization of a cell in a vortex state, depending on the direction in which the magnetization turns. There is also a singularity at the center of the cell (in an area V, called the "vortex core") in which the magnetization can no longer turn. This central area V (with a diameter of a few nanometers) has dimensions that are roughly equal to the characteristic length of exchange $L_{ex}$ (i.e. about 5 nm), which defines the minimum length below which the magnetization can no longer vary. Because the magnetization cannot vary within the vortex core V, it will tend to leave the cellular plane perpendicularly upward (the magnetization or polarity of the core p is 1) or downward (the magnetization or polarity of the core p is −1). There is therefore a second degeneration of the cell in a vortex state based on the vortex core having a magnetization that is perpendicular to the cellular plane upward (p=+1) or downward (p=−1). These two states p=+1 and p=−1 are two highly stable states relative to a perpendicular static field, particularly allowing for the creation of non-volatile memory cells, with one of the two polarities p corresponding to the "1" binary information and the other polarity p corresponding to the "0" binary information. The amplitude Hmax that is typical of the static field perpendicular to the substrate 2 to reverse the vortex core polarity is about 3000 Oe, which represents and energy barrier of about 400 times the energy of thermal fluctuations at room temperature. The application of an external planar static field of a few hundred Oersted may be sufficient to eject the vortex core from the platelet. A simple screen device using a Permalloy film (or any other high permeability material) can be used to overcome this. The screen can also protect against parasitic external electromagnetic waves.

The conditions on the dimensions of the cell such that the cell is in a vortex state imply that the thickness of the cell is greater than the length of exchange and that the cell's radius (the small radius in the case of an elliptical shape) is greater than twice the cell's thickness. In a preferred embodiment, the diameter of each of the cells is between 10 nm and 1.0 μm, and the thickness t is between 3 nm and 100 nm. In addition, the aspect ratio $\beta=t/R$ is less than or equal to 2.

As a non-limiting example, the memory cells 4 studied here are nanodisks with a thickness t=50 nm and radium R=50 nm, for an aspect ratio β equal to 1 here. The cells 4 are made of NiMnSb (Heusler allow), which is a mild magnetic material with low magnetic lot and a low Gilbert magnetic damping coefficient α of between 0.001 and 0.003.

These cells 4 are obtained, for example, by the molecular beam epitaxy, or MBE, on the substrate 2 (typically a substrate InP(001)).

Each horizontal row of cells 4 is arranged in a single third conductive line 9, said third lines being arranged horizontally on the substrate 2 and parallel to one another.

The permanent magnet 3 is arranged under the substrate 3 and is made, for example, in the form of a CoSm cylinder with a 1 cm diameter and a 5 mm thickness, producing a uniform static magnetic field $H_L$ of approximately 600 Oe perpendicular to the substrate plane. Of course, the invention is not limited to this geometry, and the permanent magnet 3 can be arranged otherwise. For example, a second embodiment of magnetic storage device according to the invention would be identical to the device in FIG. 2, the only difference being that is does not have a lower permanent magnet and that the permanent magnet is replaced by a plurality of line pairs made from a perpendicular magnetization material used to create a permanent bias field. Each line pair coincides with a pair of lines 8a and 8b, the lines being electrically insulated by an insulating layer. The other means forming the device would be identical to the means described in the invention with reference to FIG. 2.

Each of the cells 4 is in contact on its upper plane with a corresponding reading cone 7.

Each cone 7 provides electrical contact between the corresponding cell 4 and the second line 6 above. Above the second line 6, there is a first conductive line 5.

For each cell 4, the projection, in the plane of the cell 4, of the third line 9 located below the cell 4 and the second 6 and first 5 lines located above the cell 4 give three intersecting lines roughly at the level of the cell.

Each first line 5 is, for example, an Au line with a thickness of 300 nm. These first conductive lines 5 arranged parallel to each other according to a first level of metallization are, for example, obtained by evaporation on a $Si_3N_4$ protective layer 10 (not shown in FIG. 2) that is 50 nm thick.

As we have already mentioned, the device 1 according to the invention also comprises a plurality of conductive line pairs 8a and 8b that are rippled and arranged on the substrate 2 according to a third level of metallization. The ripple of the two lines 8a and 8b make it possible to adopt the shape of the cell 4 (i.e. the two lines 8a and 8b extend to the cell located between the two lines and then come back together). These rippled conductive lines 8a and 8b are, for example, Au strips with a thickness of 50 nm, the distance d separating the line 8a (resp. 9b) from the cell 4 it surrounds being, for example, equal to 100 nm.

Figure 4:
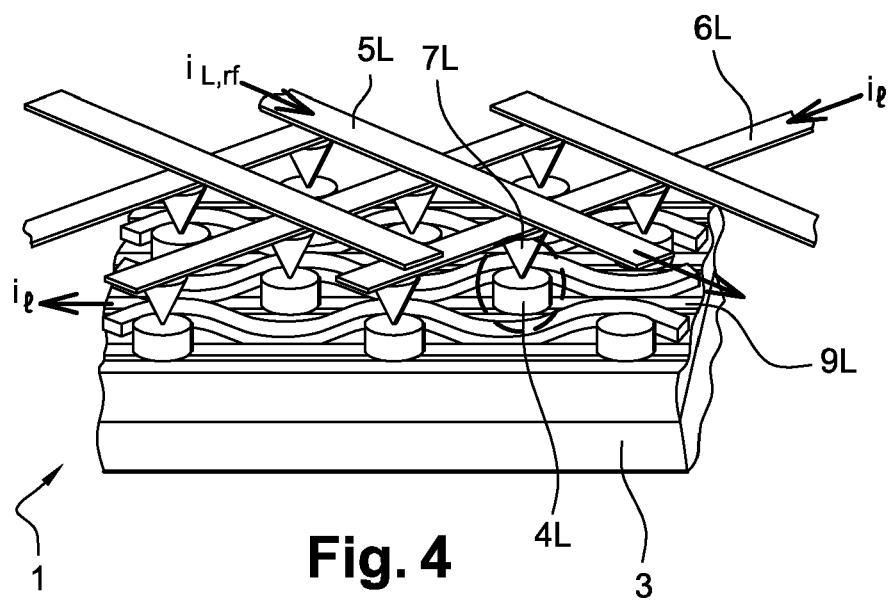
FIG. 4 shows a mechanism for reading information in a cell of the device according to the invention.

With reference to FIG. 4, we will describe the method for reading the equilibrium state of a cell 4L, identified (circled in the figure) on the device 1 according to the invention. Reading the equilibrium state means determining whether the vortex core of the circled cell 4L has a magnetization perpendicular to the cellular plane upward (p=+1) or downward (p=−1).

The permanent magnet 3 makes it possible to create a bias static magnetic field $H_L$ perpendicular to the cellular plane 4L. The presence of this static field $H_L$ makes it possible to lift the degeneracy of the gyroscopic movement of the vortex core by obtaining two different resonant frequencies $f_{L,p=+1}$ and $f_{L,p=-1}$, respectively corresponding to the gyration of the vortex core with its polarity p is equal to 1 or −1.

Figure 5:
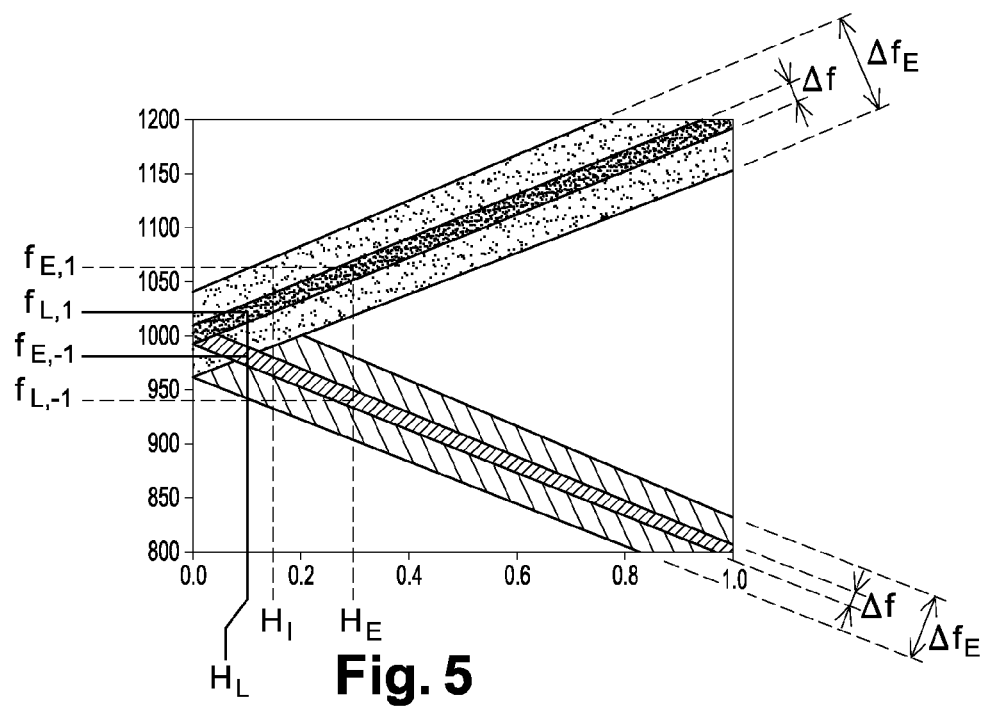
FIG. 5 shows the change in the resonant frequencies of gyration in a cell in the vortex state based on the amplitude of a static magnetic field perpendicular to the cellular plane.

The amplitude of the static field $H_L$ should be high enough that the difference $f_{L,p=+1}-f_{L,p=-1}$ is greater than $\Delta f$, which constitutes the intrinsic line width of the cell 4L at the vortex state. This intrinsic line width $\Delta f$ is typically equal to 10 MHz. This condition is illustrated in FIG. 5, which represents the change in the resonant frequencies of gyration at the vortex core in MHz $f_{p=+1}$ and $f_{p=-1}$, based on the amplitude of the perpendicular static field in kOe applied to the read cell. When a low amplitude static field is applied, the two frequencies are separated from one another and change roughly linearly. The intrinsic line width $\Delta f$ is represented by thick hash marks for the frequency $f_{L,p=-1}$ and by thick hash marks $f_{L,p=+1}$. Purely as an example, FIG. 5 shows that, for a static field with an amplitude $H_L$=100 Oe, there are two frequencies $f_{L,1}$ and $f_{L,-1}$, the difference being much greater than $\Delta f$.

The choice of a suitable perpendicular static field therefore makes it possible to make the gyration at the vortex core selective by frequency.

Having a static field amplitude $H_L$ such that the difference $f_{L,p=+1}-f_{L,p=-1}>\Delta f$ can be produced by the inequality:

$H_L$>Hmin=$\alpha$Hs where Hs is the saturation magnetic field for the cell at the vortex state and $\alpha$ the Gilbert magnetic damping coefficient. In the example using NiMnSb for the magnetic cell, Hmin is roughly equal to 30 Oe. It is important in the device according to the invention that, for the purposes of increasing efficiency and minimizing energy consumption both during the writing and reading phase, $\alpha$ is the lowest possible. As a non-limiting example, techniques for reducing $\alpha$ may consist of choosing materials comprising the cell with low coefficients $\alpha$, using epitaxial thin layers, creating very flat interfaces, using materials with a large spin diffusion length on both sides of the interfaces (e.g. Cu, Al, Ag), and a platelet thickness that is not too thin.

The amplitude of the static field H should also be less than the amplitude Hmax of the static field, which would result in the reversal of polarity of the vortex core. This value Hmax weakly depends on the aspect ratio and the value of Hs. In the example used, having a NiMnSb disk with an aspect ratio of $\beta$=1, Hmax is roughly equal to 3000 Oe.

In the first line 5L located above the cell 4L a radio frequency current $i_{L,rf}$ is read at one of two frequencies $f_{L,p=+1}$ or $f_{L,p=-1}$. We will assume hereafter that the frequency of $i_{L,rf}$ is equal to $f_{L,p=+1}$. The current $i_{L,rf}$ will generate a dynamic magnetic field with linear polarization under the first line 5L plane-parallel to the cellular plane to be read 4L.

Using a radio frequency field with linear polarization makes it possible to include both right and left circularly polarized field.

Let's suppose that the polarity p of the vortex core of the cell 4L is equal to 1. In this case, because the bias frequency of the dynamic field is equal to $f_{L,p=+1}$, the vortex core will turn by coupling to one of the two circular polarization. The rotation of the vortex core will result in a local heating of the roughly cylindrical central area 11 of the cell (as shown in FIG. 3), whose diameter is approximately the diameter of gyration of the vortex core.

The current $i_{L,rf}$ should be chosen such that the power of the dynamic field does not reverse the polarity of the cell that we are trying to read.

The reading is then done by injecting a continuous current $i_I$ into the cell 4L via the second line 6L located above the cell 4L. The current passes through the cone 7L located above the cell 4L, then through the cell 4L, and then finally through the third line 9L under the cell 4L. The cone 7L will allow the current $i_I$ to be concentrated only in the region 11 that is heating. The local heating leads to an increase in the resistance of the cell 4L.

Of course, if the polarity p of the vortex core of the cell 4L is equal to −1, the vortex core virtually will not turn since the frequency of polarization of the dynamic field is equal to $f_{L,p=+1}$.

It is also possible to add an interface (ex. vanadium oxide) whose resistance is highly sensitive to the temperature between the cone 7L and the second line 6L.

According to this method of reading, first all of the cells located under the first lines 5L, traveled by $i_{L,rf}$, and whose equilibrium state is p=+1 (for a frequency $f_{L,p=+1}$ of the dynamic field) are heated (without reversing the polarity), and then the resistance value of each cell is read individually to determine its equilibrium state.

Note that one of the other frequencies $f_{L,p=+1}$ or $f_{L,p=-1}$ may also be used to read information in a cell.

In summary, the device 1 according to the invention comprises means for reading the preferably resonant polarity based on a selective measure of transport between two intersecting lines 6 and 9 by guiding the current lines through the vortex core by means of a point contact 7.

The reading can be done by any other method that can locally discriminate between the p=+1 and p=−1 polarity introduced by the static field $H_L$. An example is the use of giant magnetoresistance to insert a ferromagnetic layer between layer 6 and layer 7 of the cone. One form of implementation is the use of the diode effect, which is a combination of a perpendicular radiofrequency current the follows the path traveled by $I_{L,rf}$—between line 6 and contact 9—and the resistance oscillations due to the excitation of the gyrotropic mode. In this case, the magnetic layer inserted between 6 and 7 should have a magnetization in the plane.

Another more direct implementation of detecting the polarity p would be that the magnetic layer inserted between 6 and 7 has a magnetization outside of the fixed plane. In this case, the potential drop at the contact terminals is directly tied to p.

Figure 6:
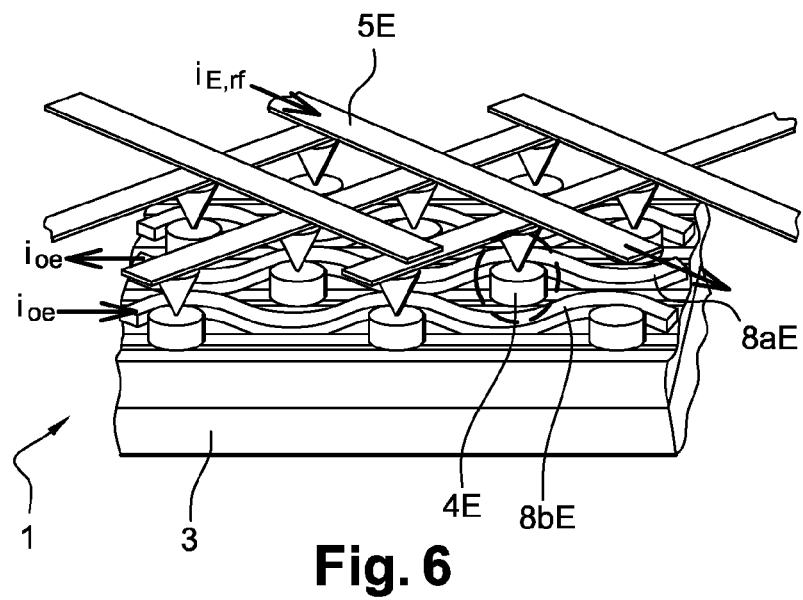
FIG. 6 shows a mechanism for writing information to a cell of the device according to the invention.

With reference to FIG. 6, we will describe the mechanism for writing the equilibrium state of a cell 4E, identified (circled in the figure) on the device 1 according to the invention. By writing the equilibrium state, this means controlling the orientation of an equilibrium state p=+1 or p=−1 in the cell 4E, each of the two being highly stable and allowing the creation of non-volatile memory states, with one of the two polarities p corresponding to "1" binary information and the other polarity p corresponding to "0" binary information.

As mentioned in reference to FIG. 4, the method for reading can heat without reversing all of the cells in an equilibrium state (p=+1 or p=−1) and located on a single first line. It is therefore conceivable that, to be selective at the time of writing, a component $H_{Oe}$ should be added locally (in the vicinity of the cell 4E where we are trying to write information) to the static perpendicular field $H_L$, which will make it possible to move the gyration frequency only in the vicinity of the cell being written. To do this, we use a pair of lines 8aE and 8bE surrounding the cell 4E. A current $+i_{Oe}$ is injected in line 8aE, and a current $-i_{Oe}$ is injected in line 8bE.

The presence of this perpendicular static field $H_E$ combining $H_{Oe}$ and $H_L$ in the vicinity of the cell 4E makes it possible to obtain two different frequencies $f_{E,p=+1}$ and $f_{E,p=-1}$, depending upon whether we are trying to reverse the polarity of the vortex core of the cell 4E from upward (p=+1) to downward (p=−1) or from downward (p=−1) to upward (p=+1).

As for reading, the amplitude of the static field $H_E$ should be high enough that the difference $f_{E,p=+1} - f_{E,p=-1}$ is greater than $\Delta f_E$, which constitutes the line width of the cell 4L at the vortex state when writing. This line width $\Delta f_E$ is generally greater than the intrinsic line width $\Delta f$ insofar as the writing current radiofrequency pulses $i_{E,rf}$ that will be used have a shorter duration than the radiofrequency pulses $i_{L,rf}$ used for reading. The value $\Delta f_E$ is typically equal to 50 MHz for 50 ns current pulses.

This phenomenon is illustrated in FIG. 5. The writing line width $\Delta f_E$ is represented by hash marks for the frequency $f_{p=-1}$ and by thinner dotted lined for the frequency $f_{p=+1}$. Purely as an example, FIG. 5 shows that, for a static field $H_E$ with an amplitude 300 Oe, there are two frequencies $f_{E,1}$ and $f_{E,-1}$, the difference being much greater than $\Delta f_E$. To apply a field $H_E$=300 Oe to the cellular level, $H_{Oe}$=200 Oe (Oersted field) must be added to the field $H_L$=100 Oe, chosen earlier. This requires passing a current of about 12 mA through the pair 8a and 8b during the writing sequence.

The amplitude of the static field $H_E$ (the first static field) should also be less than the amplitude Hmax of the static field, which would result in the reversal of polarity of the vortex core.

Once a perpendicular static field $H_E$ combining $H_{Oe}$ and $H_L$ is in the vicinity of the cell 4E, a current is injected in the first line 5E above the cell 4E where we are trying to write, the current having a radio frequency $i_{E,rf}$ at one of two frequencies $f_{E,p=+1}$ or $f_{E,p=-1}$, depending on whether we are trying to write a "0" (p=−1) or a "1" (p=+1). We will assume hereafter that we are trying to "write" the polarity of the vortex core with a value p=−1. The frequency of $i_{E,rf}$ here is thus equal to $f_{E,p=+1}$. On the first line 5E, this current $i_{E,rf}$ will generate a dynamic magnetic field with linear polarization that is plane-parallel to the cell 4E where we are trying to write.

Using a radio frequency field with linear polarization makes it possible to include both right and left circular polarization.

Let's suppose that the polarity p of the vortex core of the cell 4E is equal to +1. In this case, because the polarization frequency of the dynamic field is equal to $f_{E,p=+1}$, the vortex core will turn by coupling to one of the two circular polarization. When the radius of gyration increases, the speed of displacement of the core also increases until it reaches a critical speed causing a reversal of the magnetization at the vortex core. Once the core's polarity is reversed (p=−1), it returns to its central equilibrium position, as it is no longer coupled to the rf frequency field $f_{E,p=+1}$. The current $i_{E,rf}$ is chosen, of course, such that the power of the dynamic field reverses the polarity of the cell 4E. We have just described switching the polarity of the core from p=+1 to p=−1. Now, let's suppose that the initial polarity p of the vortex core of cell 4E is equal to −1. In this case, the vortex core virtually will not turn since the frequency of polarization of the dynamic field is equal to $f_{E,p=+1}$. Therefore, the polarity of the vortex core will remain −1.

The presence of a dynamic field at frequency $f_{E,p=+1}$ (with a linear polarization and plane-parallel to the cell 4E) therefore results in writing p=−1 in the cell 4E.

To optimize energy consumption while writing, it is preferable to apply the current to the pair 8a 8b only for the duration of the radiofrequency current pulse. There is an optimum length, amplitude, frequency, and shape for the rf pulse sent to line 5E. Optimization strategy includes an apodization in the shape of the pulse or the use of a series of pulses. The optimum frequency for the pulse is shifted to a lower frequency relative to the resonant frequency of the gyrotropic mode due to the nonlinear effects that affect the excitation power needed to reverse the vortex core. Using pulses that incorporate nonlinear effects to scan the frequency during the writing sequence can also improve efficiency.

Conversely, the presence of a dynamic field at frequency $f_{E,p=-1}$ other than the frequency $f_{E,p=+1}$ (with a linear polarization and plane-parallel to the cell 4E) will result in writing p=−1 in the cell 4E.

By adding the perpendicular field's $H_E$ static component, we introduce a frequency discrimination such that the first polarity (ex. p=+1) turns more quickly than the second polarity (ex. p=−1), so the resonance frequency of the radio frequency magnetic field needed to reverse the core's magnetization from downward to upward is different than the radio frequency magnetic field needed to reverse the core's magnetization from upward to downward. The advantage of such a device is that it makes it possible to selectively control the frequency for writing information to a cell.

We can only write to the cell 4E for which we are trying to write information. In other worlds, the risk of inadvertently writing in cells located near the cell 4E is very low for several reasons:

cells that are not on the same first line 5E are not subject to a dynamic magnetic field parallel to their plane or the amplitude required to be dynamically coupled to the rf excitation;

cells that are on the same first line 5E are not surrounded by the pair of lines 8aE and 8bE, and the static component $H_{Oe}$, created by the lines 8aE and 8bE will tend to avoid $H_L$ in the vicinity of those cells, extending their frequency from $f_{E,p=+1}$ and $f_{E,p=-1}$ and making those cells insensitive to the dynamic field.

With reference to FIG. 5, the amplitude $H_E$ of the static field is chosen to correspond exactly to the two resonant frequencies of gyration for the vortex core $f_{E,1}$ and $f_{E,-1}$. However, we can also have an amplitude $H_I$ of the static field that is less than the amplitude $H_E$. In this case, the frequencies used $f_{E,1}$ and $f_{E,-1}$ are no longer exactly equal to the resonant frequencies of gyration. Instead, they are slightly offset. The first frequency $f_{E,1}$ is between the resonant frequency of gyration for the vortex core for p=+1 and the sum of this resonant frequency and half the line width $\Delta f_E/2$. The second frequency $f_{E,-1}$ is between the resonant frequency of gyration for the vortex core for p=−1 and the difference between this resonant frequency and half the line width $\Delta f_E/2$. Because these frequencies are slightly different than the resonant frequencies of gyration, they will be less effective in causing gyration at the vortex core. The power of the radiofrequency current injected in the first line should therefore be increased. However, the energy saved during the writing sequence can be significant since the current injected in the pairs 8a and 8b is reduced. Where $H_I$=150 Oe, it is then necessary to combine a field $H_{Oe}$=50 Oe to the field $H_L$=100 Oe. This requires injecting a 3 mA current in the 8a and 8b pair, for energy savings of a factor of 16 compared to the field $H_E$ used before.

The difference between the frequencies p=+1 and p=−1 is directly proportional both to the perpendicular static field and to the geometry of the platelet. Since the invention uses a resonant phenomenon, this creates constraints on the uniformity of the cells. Field uniformity is easy to achieve for the recommended solution where a permanent macroscopic magnet is placed behind the substrate. The applicant has verified through experiments that the distribution of resonant frequencies for different disks with identical nominal diameters is technologically lower in electronic lithography and does not exceed ten MHz.

Of course, the invention is not limited to the embodiment just described.

Specifically, in the device according to the invention, it is also possible to replace a cell with multiple register cells of various sizes with different pairs of resonant frequencies for writing by using, for example, disks with different diameters. Typically, for two cells, we would use two frequencies to write a "0" or a "1" in the first cell and two other frequencies to write a "0" or a "1" in another cell overlapping the first. This results in one memory cell for coding two-bit information.

Also, even though the pairs of lines that make it possible to create the second component of the static field were described as having a rippled shape (to maintain the cell's axial symmetry), we can also consider using pairs of straight lines.

We can also imagine voluntarily introducing pinning defects in the core, which would increase the resonant frequencies beyond the homogeneous frequency. These defects could also be used to gain better control over the uniformity between the characteristics of the different cells.

The invention claimed is:

1. A magnetic storage device comprising:
   a network of flat magnetic cells on a substrate, the dimensions of each magnetic cell being chosen such that the cell is in a vortex state, a vortex core of each cell having a magnetization with a first and second equilibrium position in the opposite direction and roughly perpendicular to a plane of said cell, each of said two positions representing a piece of binary information;
   means for writing binary information stored in the cells, said means of writing including means for selectively and simultaneously applying the following in the vicinity of each cell:
   a first static magnetic field with roughly perpendicular bias to said plane;
   a radio frequency magnetic field with linear polarization, including two right and left circular polarization roughly parallel to said plane,
   such that:
   a simultaneous application of said first static magnetic field and said radio frequency magnetic field at a first frequency on the selected cell causes:
   a switch in the magnetization direction of said vortex core located in the first equilibrium position toward the second equilibrium position under the effect of a circular movement of the core around said first equilibrium position, causing the reversal in the magnetization, said vortex core rotating by being coupled to one of the two circular polarizations;
   the maintenance of the magnetization direction of said vortex core located in the second equilibrium position;
   a simultaneous application of said first static magnetic field and said radio frequency magnetic field at a second frequency that is different than said first frequency on the selected cell causes:
   a switch in the magnetization direction of said vortex core located in the second equilibrium position toward the first equilibrium position under the effect of a circular movement of said core around said second equilibrium position, causing the reversal in the magnetization, said vortex core rotating by being coupled to one of the two circular polarizations;
   the maintenance of the magnetization direction of said vortex core located in the first equilibrium position.

2. A device according to claim 1, comprising means of reading binary information stored on cells, said means of reading including:
   a means for simultaneously applying the following in the vicinity of the cell to be read:
   a second static magnetic field with roughly perpendicular bias to said plane;
   a radio frequency magnetic field with linear polarization roughly parallel to said plane;
   such that when the frequency of said radio frequency magnetic field is equal to a third frequency, a simultaneous application of said second static magnetic field and said radio frequency magnetic field on the selected cell results in:
   an absorption of the radio frequency power by the selected cell corresponding to the excitation of a circular movement of said vortex core located in the first equilibrium position around said first equilibrium position, this radiofrequency absorption resulting in a local heating without resulting in the magnetization reversal;
   the maintenance of the magnetization direction of said vortex core located in the second equilibrium position;
   means for selectively injecting in the cell a reading probe current.

3. A device according to claim 2, wherein an amplitude H of said first static magnetic field and said second static magnetic field is such that:
   Hmin<H<Hmax where
   Hmin is equal to the product αHs, meaning the width of the resonance frequency line expressed in terms of Hs, Hs meaning the vortex state cell's saturation magnetic field, and a, meaning the Gilbert magnetic damping coefficient, and
   Hmax means the amplitude of the static field that would result in the reversal of the magnetization direction of the vortex core.

4. A device according to claim 2, wherein the amplitude of said first static field is greater than the amplitude of said second static field.

5. A device according to claim 2, wherein said means for selectively injecting in the cell a probe reading current include a point contact for circulating the current through the regions around the vortex core of said cell to be read.

6. A device according to claim 2, wherein said means of writing comprise a plurality of parallel first conductive lines arranged in the vicinity of said cells, each of said lines being able to receive a current of equal frequency at said first frequency or at said second frequency for the application of a linearly polarized radio frequency magnetic field at said first frequency or at said second frequency roughly parallel to the plane located below said line.

7. A device according to claim 6, wherein each of said lines of said plurality of first lines is able to receive a current of equal frequency to said third frequency for the application of a linearly polarized radio frequency magnetic field to said third frequency roughly parallel to the plane located below said line.

8. A device according to claim 2, wherein said means of writing comprise a permanent magnet parallel to the substrate for the application of a component of said first static bias magnetic field roughly perpendicular to the plane.

9. A device according to claim 8, wherein said permanent magnet is arranged under said substrate and is made of a material such as BiMn, AlNiCo, or RCo, where R=Y, La, Pr, Nd, or Sm.

10. A device according to claim 8, wherein said permanent magnet is made in the form of a magnetic layer having perpendicular anisotropy.

11. A device according to claim 10, wherein said means for applying said second static magnetic fields are formed by said permanent magnet parallel to the substrate.

12. A device according to claim 1, wherein said means for writing comprise a plurality of pairs of conductive lines arranged in a single plane in the vicinity of said cells, the lines of a single pair being arranged on both sides of a row of cells, each of said lines being able to receive a continuous current such that two successive lines from a single pair receive a current in the opposite direction for the application of a component of said first bias static magnetic field roughly perpendicular to the planes in the vicinity of the cells located between the two successive lines.

13. A device according to claim 12, wherein two lines from a single pair are rippled such that they surround the cells located between the two lines.

14. A device according to claim 1, wherein said cells are made of a ferromagnetic material having a Gilbert magnetic damping coefficient that is less than or equal to 0.03.

15. A device according to claim 1, wherein said cells are made of a ferromagnetic material having a Gilbert magnetic damping coefficient that is greater than or equal to 0.0001.

16. A device according to claim 1, wherein said cells are made of a ferromagnetic material selected from among the following materials:
- a metal alloy like an NiFe alloy;
- a metallic monocrystal, such as a Heusler alloy like NiMnSb, $CO_2MnSi$, or $CO_2MnAl$ or such as a pure metal like Fe;
- a magnetic semiconductor such as GaMnAs;
- an insulating monocrystal, such as $Y_3Fe_5Oi_2$ or $Fe_3O_4$, covered by a conductive layer serving as a bolometric detector.

17. A device according to claim 1, wherein each of said cells has a circular, elliptical, or plane-parallel shape.

18. A device according to claim 17, wherein a smallest dimension of each said cell, such that the diameter in the case of a circular cell, a smaller of the two diameters in the case of an elliptical cell, or a length in the case of a plane-parallel cell, is between 10 nm and 1 μm.

19. A device according to claim 1, wherein each of said cells has a thickness of between 3 nm and 100 nm.

20. A device according to claim 1, wherein each of said cells has an aspect ratio $\beta$ that is less than or equal to 2.

21. A device according to claim 1, wherein said first frequency is roughly equal to the resonant frequency of gyration at the vortex core in the first equilibrium position and said second frequency is roughly equal to the resonant frequency of gyration of the vortex core in the second equilibrium position.

22. A device according to claim 1, wherein:
said first frequency greater than or equal to the resonant frequency of gyration of the vortex core in the first equilibrium position and less than or equal to the sum of said resonant frequency of gyration of the vortex core in the first equilibrium position and half the line width of said resonant frequency of gyration of the vortex core in the first equilibrium position; and
said second frequency is less than or equal to the resonant frequency of gyration of the vortex core in the second equilibrium position and greater than or equal to the difference between said resonant frequency of gyration of the vortex core in the second equilibrium position and half the line width of said resonant frequency of gyration of the vortex core in the second equilibrium position.

* * * * *